(12) United States Patent
Marcade et al.

(10) Patent No.: US 11,659,679 B1
(45) Date of Patent: May 23, 2023

(54) TELESCOPING CABINET RAIL

(71) Applicant: ZT Group Int'l, Inc., Secaucus, NJ (US)

(72) Inventors: Michael Dennis Marcade, Secaucus, NJ (US); Vladimir Lipnevici, Secaucus, NJ (US); Ellie Elsu, Secaucus, NJ (US)

(73) Assignee: ZI Group Int'l, Inc., Secaucus, NJ (US)

( * ) Notice: Subject to any disclaimer, the term of this patent is extended or adjusted under 35 U.S.C. 154(b) by 0 days.

(21) Appl. No.: 17/508,112

(22) Filed: Oct. 22, 2021

(51) Int. Cl.
| H05K 7/14 | (2006.01) |
| A47B 88/00 | (2017.01) |
| A47B 96/14 | (2006.01) |
| H05K 7/18 | (2006.01) |
| A47B 88/43 | (2017.01) |

(52) U.S. Cl.
CPC ........... *H05K 7/1489* (2013.01); *A47B 88/43* (2017.01); *A47B 96/14* (2013.01); *H05K 7/183* (2013.01); *H05K 7/1488* (2013.01)

(58) Field of Classification Search
CPC .... H05K 7/1489; H05K 7/1488; H05K 7/183; A47B 96/14; A47B 88/43; A47B 88/423; A47B 96/07
See application file for complete search history.

(56) References Cited

U.S. PATENT DOCUMENTS

| RE31,106 | E | * | 12/1982 | Pufpaff | F16B 21/02 |
| | | | | | 403/162 |
| 6,142,590 | A | * | 11/2000 | Harwell | H05K 7/1494 |
| | | | | | 312/334.8 |
| 6,347,042 | B1 | * | 2/2002 | White | H05K 7/142 |
| | | | | | 174/138 D |
| 6,590,768 | B1 | * | 7/2003 | Wiley | G06F 1/20 |
| | | | | | 257/E23.099 |
| 6,948,691 | B2 | * | 9/2005 | Brock | H05K 7/1489 |
| | | | | | 312/334.44 |
| 8,356,718 | B2 | * | 1/2013 | Yang | H05K 7/1489 |
| | | | | | 211/26 |
| 9,699,935 | B1 | * | 7/2017 | Marrs | A47B 88/00 |
| 10,111,358 | B2 | * | 10/2018 | Wu | H05K 7/1487 |
| 10,638,634 | B1 | * | 4/2020 | Elsasser | H05K 9/0062 |
| 2001/0040203 | A1 | * | 11/2001 | Brock | H02B 1/34 |
| | | | | | 211/192 |
| 2002/0093795 | A1 | * | 7/2002 | Gough | H05K 7/1489 |
| | | | | | 361/727 |

(Continued)

*Primary Examiner* — Kimberley S Wright
(74) *Attorney, Agent, or Firm* — Dergosits & Noah LLP; Todd A. Noah (57) ABSTRACT

A telescoping rail is provided that may be fitted to a rack from the interior of the rack, and that may be adjusted from the interior to adapt to racks of different depths. The rail includes an outer rail with pins configured to engage a rear rack post. A track in the outer rail is provided with anti-rotational nuts. An inner rail is fastened to the outer rail with screws passing through the inner rail to the anti-rotational nuts. The combined length of the inner and outer rails may be adjusted for the particular cabinet depth by sliding the anti-rotational nuts along the track and the screws tightened. The inner rail may be fastened to a front rack post. A third, moving rail attaches to a device to be housed in the rack, with the moving rail sliding within groves in the inner rail.

8 Claims, 13 Drawing Sheets

(56) References Cited

U.S. PATENT DOCUMENTS

| | | | |
|---|---|---|---|
| 2003/0136749 A1* | 7/2003 | Williams | A47B 88/43 211/175 |
| 2006/0284038 A1* | 12/2006 | Hartman | A47B 88/43 248/298.1 |
| 2010/0314337 A1* | 12/2010 | Yang | H05K 7/1489 211/26 |
| 2015/0129526 A1* | 5/2015 | Chen | A47B 88/43 384/20 |
| 2015/0216071 A1* | 7/2015 | Fan | H05K 7/1489 384/21 |
| 2018/0177066 A1* | 6/2018 | White | H05K 7/1489 |
| 2018/0242472 A1* | 8/2018 | Wu | H05K 7/1487 |

* cited by examiner

TELESCOPING CABINET RAIL

BACKGROUND

With some server cabinets, e.g., telco cell site server cabinets, the depth from front posts to rear posts may vary between models. In addition, access to the rear posts from outside the cabinet may not be guaranteed. Thus, when installing a rail, some cabinets may not provide outside access to adjust the rail length.

Figure 1:
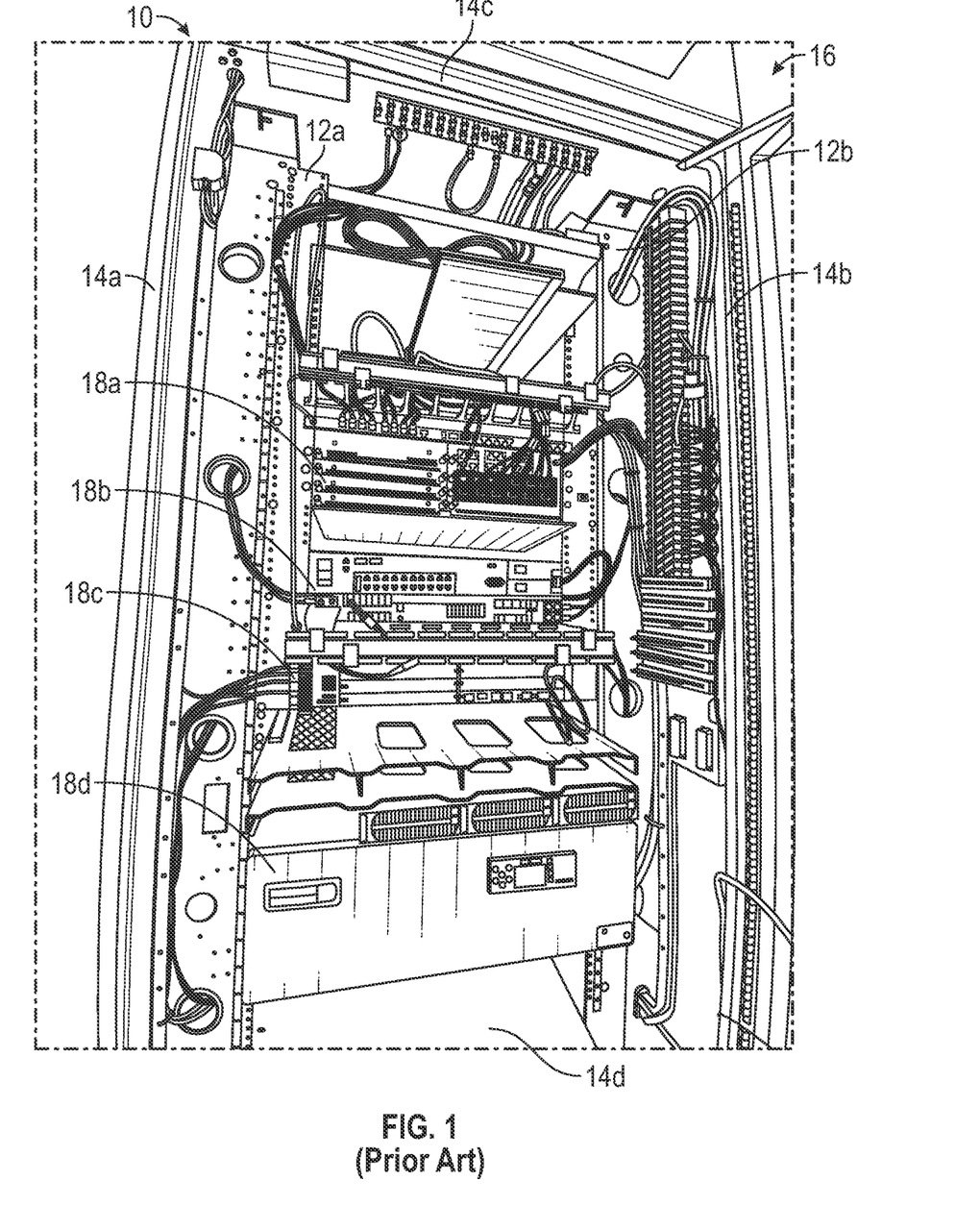
FIG. 1 is a front perspective view of an example prior art cabinet housing electronics.

For example, is a front perspective view of an exemplary cabinet 10 (e.g., a telecom cabinet) housing electronics 18a . . . 18d. In FIG. 1, posts 12b, 12b connect electronics 18a . . . 18d to cabinet 10. Cabinet 10 provides for front access 16 to electronics 18a . . . 18d, but side walls 14a, 14b, the rear wall (not shown), ceiling 14c, and floor 14d prevent side and rear access. As a result, fitting rails to posts 12a, 12b must be done through front access 16.

As a result, a technician may need to pre-configure a rail length multiple times before finding the length that fits a particular cabinet. A typical rail is not adjustable from the interior of a cabinet.

Thus, what is needed is rail that may be adjusted from the interior of a cabinet to adapt the rail to the cabinet.

BRIEF DESCRIPTION OF THE DRAWINGS

The embodiments are illustrated by way of example and not limitation in the accompanying drawings, in which like references indicate similar elements, and in which.

DETAILED DESCRIPTION

Embodiments described within disclose a telescoping rail that is adjustable to work with different rack or cabinet depths and can also be adjusted and installed without rear or side access.

Figure 2:
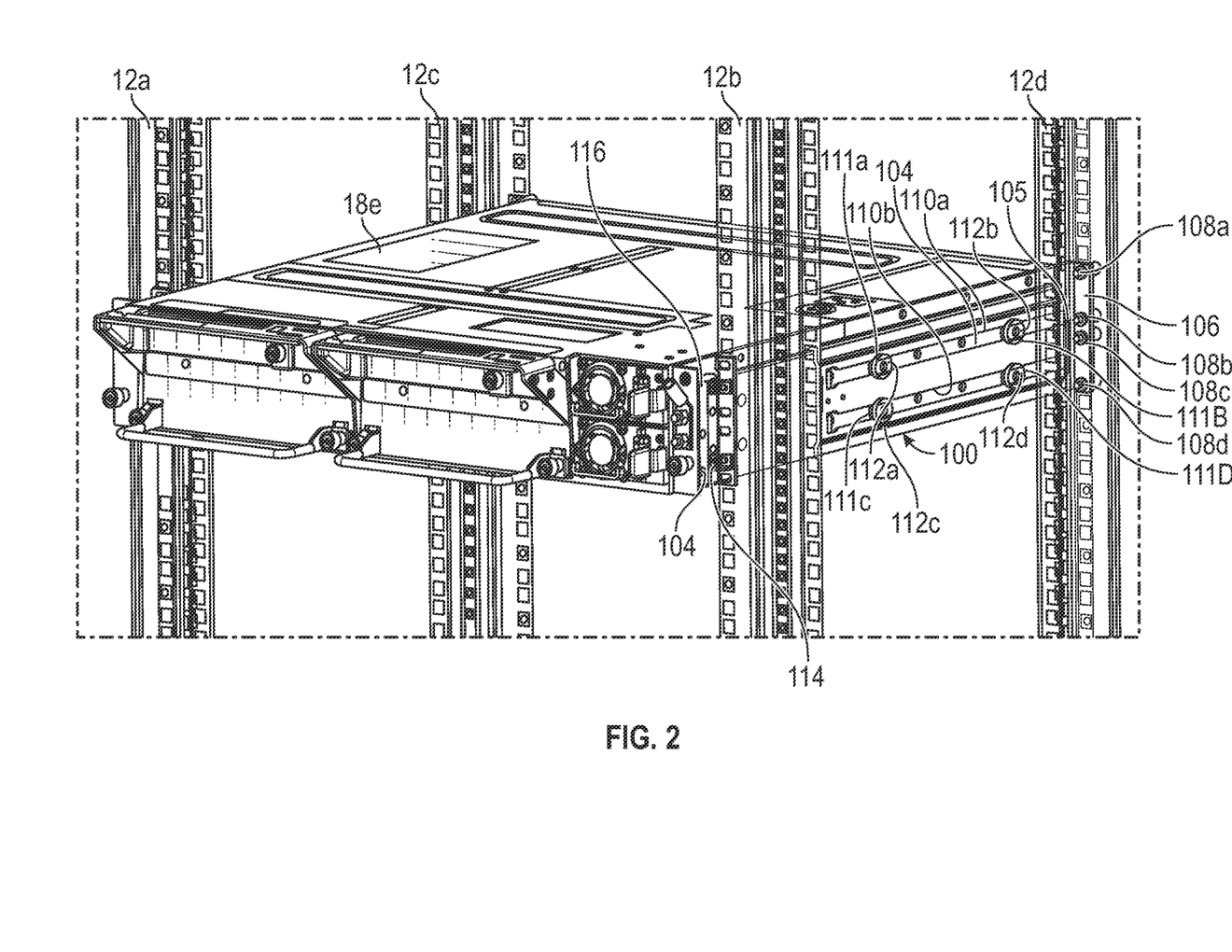
FIG. 2 is a front right isometric view of an embodiment of a telescoping rail.

FIG. 2 is a front right isometric view of an embodiment of a telescoping rail 100. In FIG. 2 telescoping rail 100 is the right side rail of a pair of rails used to secure electronic device 18e to posts 12a . . . 12d. The left-side rail is a mirror image of rail 100 and discussion of right-side rail 100 is equally applicable to the left-side rail after accounting for it being a mirror image. For clarity, cabinet 10 is depicted using just posts 12a . . . 12d and posts 12a, 12b are rendered partially transparent. It should be remembered that cabinet 10 includes side walls 14a, 14b, a rear wall, ceiling 14c, and floor 14d, that prevent access to rail 100 from the outside of cabinet 10. Rail 100 includes an outer rail 102 and an inner rail 104. Outer rail 102 may include a flange 106 with guide pins 108a . . . 108d that are shown inserted into square holes 900 (FIG. 9) in a front face of post 12d. Guide pins 108a . . . 108d point to the rear of cabinet 10, which allows pins 108a . . . 108d to be inserted into holes 900 from the front of cabinet 10 and from within the cabinet—between posts 12a and 12c on one side and posts 12b and 12d on the other. Outer rail 102 may be joined to inner rail 104 using fasteners 111a . . . 111d. In this embodiment, each fastener 111a . . . 111d includes an anti-rotational nut 112a . . . 112d and a screw 612a . . . 612d (FIG. 6). Anti-rotational nuts 112a, 112b are within a slot 110a in outer rail 102 and nuts 112c, 112d are within a slot 110b. Inner rail 104 includes a flange 114 that is fastened to the front face of post 12b. In the embodiment, flange 114 is part of a bracket 116 attached to inner rail 104.

In the embodiment of FIG. 2, slots 110a, 110b are one type of track that may be used to allow inner rail 104 to slide with respect to outer rail 102. In other embodiments, different types of tracks may be employed to allow relative motion between inner and outer rails 102, 104. For example, the position of the slot may be reversed, with the slot being incorporated into inner rail 104 and with angled edges so that screws 612 tighten to be flush with the surface of rail 104. In such a configuration, threaded holes may be provided in outer rail 102 with screws 612 passing through a slot in inner rail 104 to the threaded hole in outer rail 102. Such a configuration still allows for rails 102, 104 to be adjusted to different lengths and to be fixed at the different length from the inside of the cabinet.

In embodiments, telescoping rail 100 may be configured and dimensioned to work in cabinets with Electronic Industries Association (EIA) post dimensions with standard depths between front and rear posts of 12" and 24" and standard widths of 19" and 23", which allows the same telescoping rail to be used in multiple different cabinets.

In embodiments, telescoping rail 100 may be configured and dimensioned to be compatible with an existing inner, moving rail 120 (FIG. 3B) that attaches to the electronic device and allows the device to be slid forward from cabinet 10 for, e.g., service or repair.

Figure 3A:
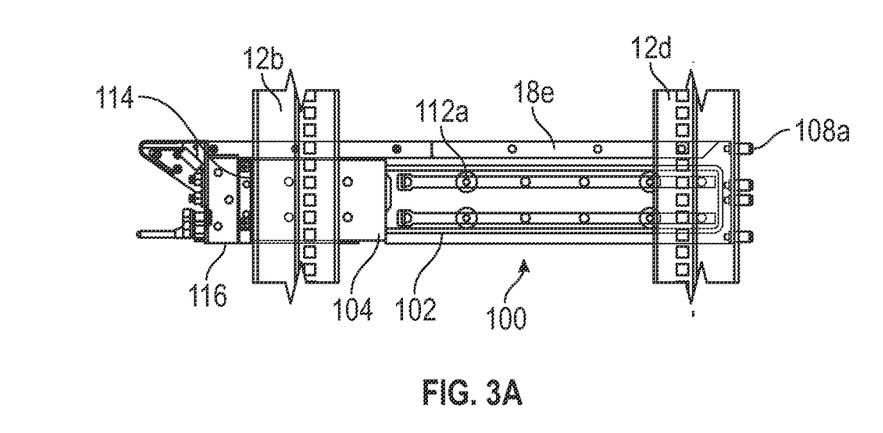
FIG. 3A is a right view of an embodiment of a telescoping rail in an inserted state.
Figure 3B:
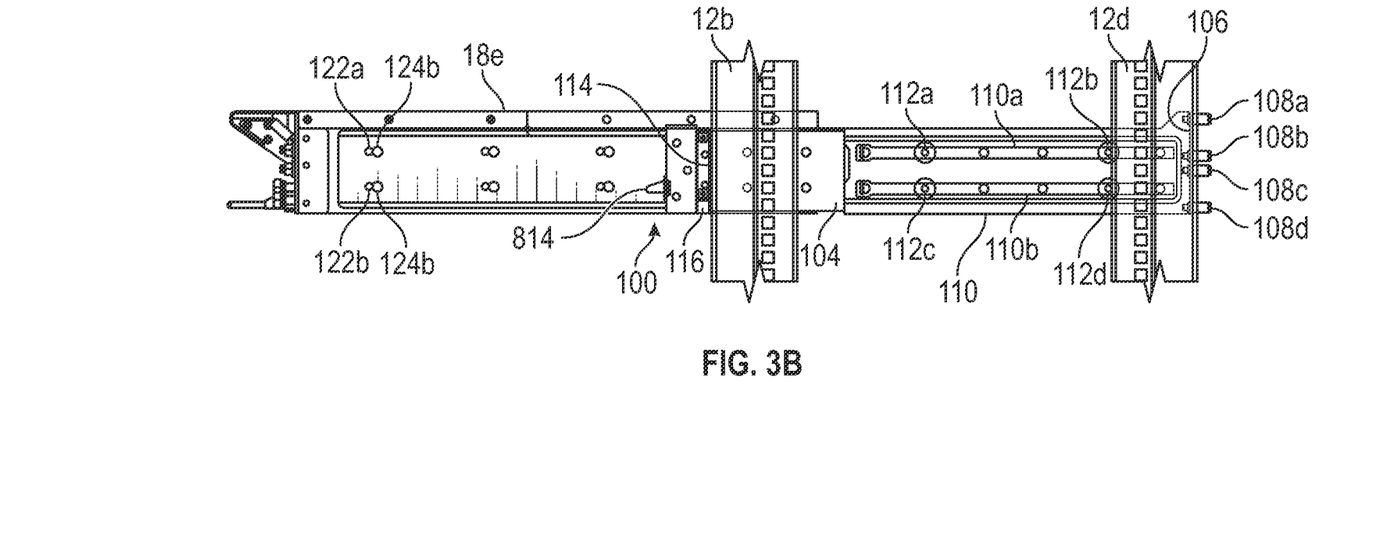
FIG. 3B is a right view of an embodiment of a telescoping rail in an extended state.

FIG. 3A is a right view of an embodiment of a telescoping rail with electronic device 18e in a fully inserted and locked state and FIG. 3B is a right view of an embodiment of a telescoping rail with electronic device 18e in an extended state, and with posts 12b, 12d rendered partially transparent. In FIG. 3A and FIG. 3B, telescoping rail 100 is shown to include a moving rail 120 that is fastened to electronic device 18e using, e.g., T-nuts 122a, 122b that engage slots 124a, 124b. Moving rail 120 is slidably connected to inner rail 104, allowing electronic device 18e to be extended from cabinet 10 for service or removal. A safety latch 802 (FIG. 10A) indicated by a lever 814 (FIG. 3B) prevents rail 120 from being completely removed from inner rail 104 accidentally.

Figure 4A:
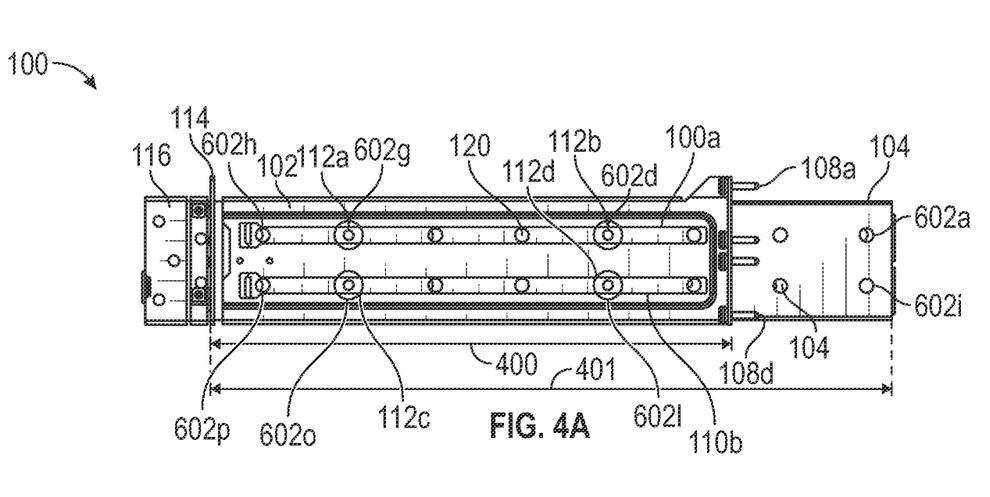
FIG. 4A is a right view of an embodiment of a telescoping rail.
Figure 4B:
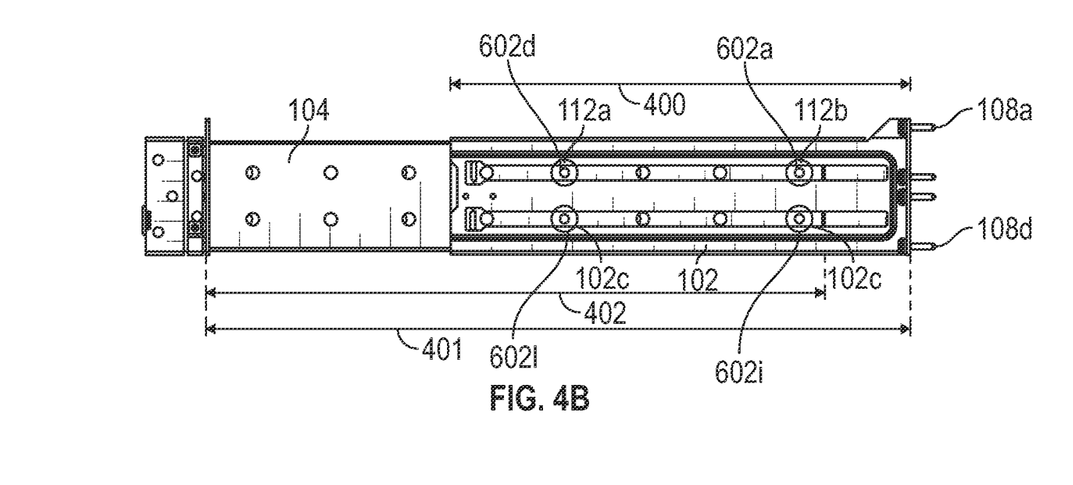
FIG. 4B is a right view of an embodiment of a telescoping rail.
Figure 4C:
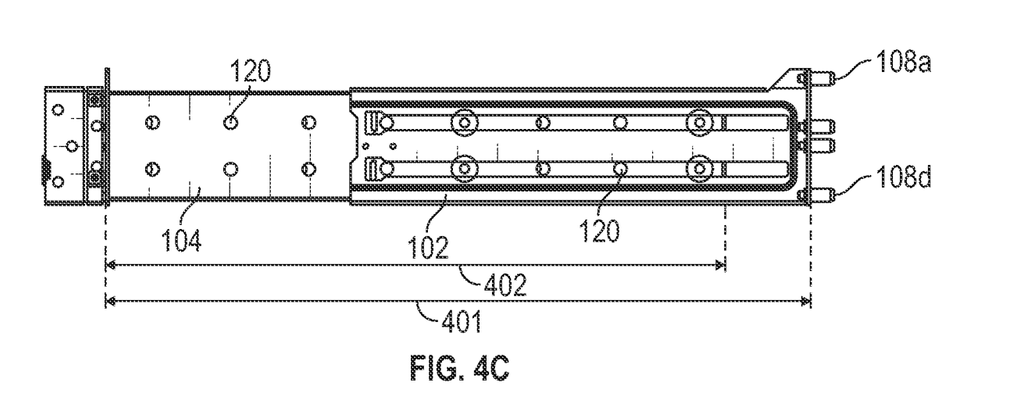
FIG. 4C is a right view of an embodiment of a telescoping rail.

FIG. 4A, FIG. 4B, and FIG. 4C are right views of an embodiment of a telescoping rail. In FIG. 4A, outer rail 102 has a length 400 and inner rail 104 has a length 401. With fasteners 111a . . . 111d (FIG. 2) in the holes of inner rail 104 as shown (as evidenced by nuts 112a . . . 112d), a distance 402 between flanges 114, 106 is less than length 401. With fasteners 111a . . . 111d loose or unlocked, inner rail 104 and outer rail may be moved relative to each other to the extent allowed by the travel of fasteners 111a . . . 111d within slots 110a, 110b. Fasteners 111a . . . 111d are then tightened or locked to maintain inner rail 104 and outer rail 102 at the desired relative position, i.e., the position where distance 402 puts flanges 114, 106 at the spacing necessary for installation in a particular cabinet. In FIG. 4B, fasteners 111a . . . 111d have been moved to a second set of holes in inner rail 104, which allows inner rail 104 and outer rail 102 to be connected with distance 402 considerably more than length 401 or 400. FIG. 4B and FIG. 4C illustrate that pins 108a . . . 108D may vary in thickness to match an associated hole in a cabinet post, e.g., smaller diameter pins may slide smoothly into threaded holes. Similarly, the shape of pins 108 may vary as well, and round pins may be used in square holes, and vice versa.

In FIG. 4A, fasteners 111a . . . 111d (as evidenced by nuts 112a . . . 112d) are disposed in holes 602g, 602d, 602o, 602l, respectively. In FIG. 4B, fasteners 111a . . . 111d (as evidenced by nuts 112a . . . 112d) are disposed in holes 602d, 602a, 602l, 602i, respectively. This illustrates an aspect of an embodiment in which anti-rotational nuts 112a . . . 112d within slots 110a, 110b, and multiple optional holes 602a . . . 602p and allow for two levels of rack depth adjustability. In one level of adjustability, fasteners 111a . . . 111d are installed in a set of holes and not fully tightened. This allows for rails 102, 104 to slide in either direction to achieve a desired length 402. Once the length is set, screws 612a . . . 612d can be tightened to fix the rail length from the inside of the cabinet. Thus, the only tool needed to install the telescoping rail is a screwdriver (or tool matching the particular fastener) and the installation may be accomplished from inside the cabinet. If more or less length 402 is necessary, fasteners 111a . . . 111d may be moved to another subset of hole locations 602a . . . 602p. This allows the same telescoping rail to be used in racks with depth ranging from, e.g., 12" to 24" with rails 102, 104 of an appropriate length.

Figure 5A:
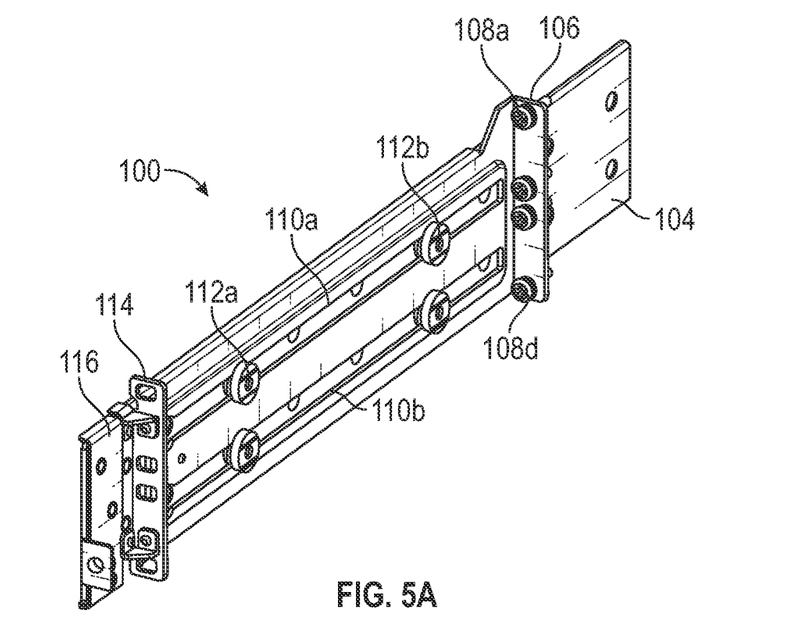
FIG. 5A is a front right isometric view of an embodiment of a telescoping rail.
Figure 5B:
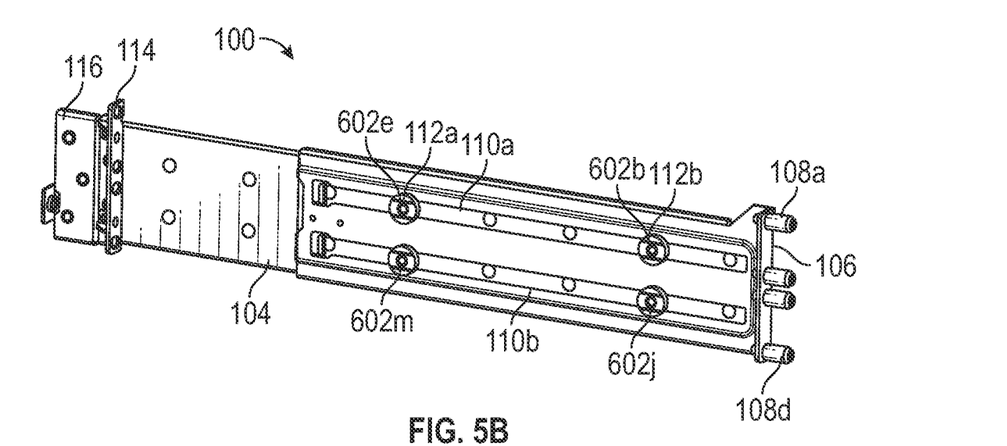
FIG. 5B is a rear right isometric view of an embodiment of a telescoping rail.

FIG. 5A is a front right isometric view of an embodiment of a telescoping rail. FIG. 5A provides a perspective view illustrating the position of anti-rotational nuts 112a . . . 112d within slots 110a, 110b. Screws 612a . . . 612d are not visible in FIG. 5A. FIG. 5B illustrates that fasteners 111a . . . 111d may be positioned within holes 602e, 602b, 602m, 602j, respectively.

Figure 5C:
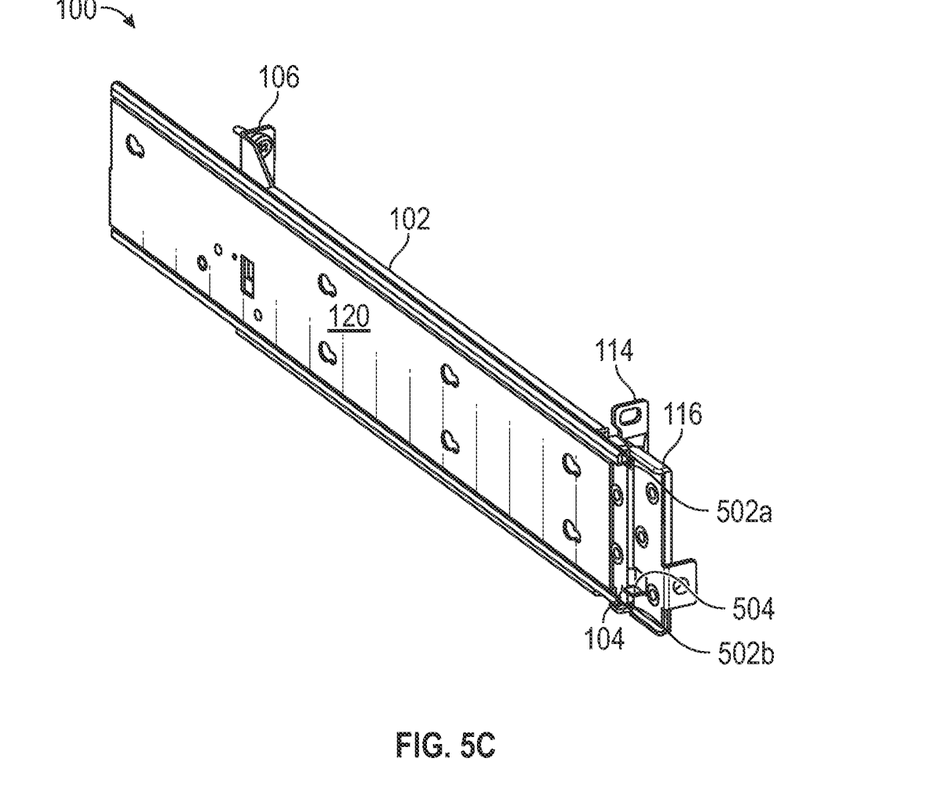
FIG. 5C is a front left isometric view of an embodiment of a telescoping rail.

FIG. 5C is a front left isometric view of an embodiment of a telescoping rail. In FIG. 5C, moving rail 120 is shown to be received by grooves 502a, 502b in inner rail 104. Grooves 502a, 502b allow moving rail 120 to slide with respect to inner rail 104. FIG. 5C further illustrates a striker 504 pointing inward from rail 104. Striker 504, connected to inner rail 104, is part of safety latch 802, which is described further with regard to FIGS. 8A, 10A, 10B, and 10C.

Figure 6A:
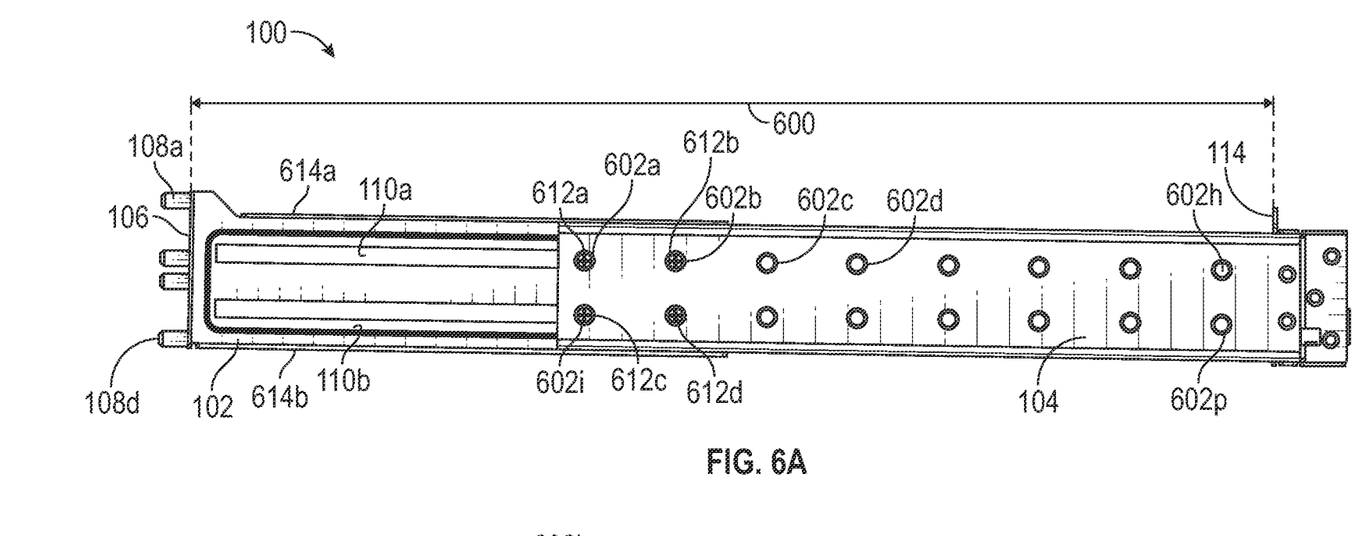
FIG. 6A is a left view of an embodiment of a telescoping rail.

FIG. 6A is a left view of an embodiment of a telescoping rail. In FIG. 6A, screws 612a . . . 612d are disposed in holes 602a, 60b, 602i, 602j, respectively. In this configuration and using four fasteners, a distance 600 may be maximized. In FIG. 6A, outer rail 102 is shown to include flanges 614a, 614b between which inner rail 104 slides.

Figure 6B:
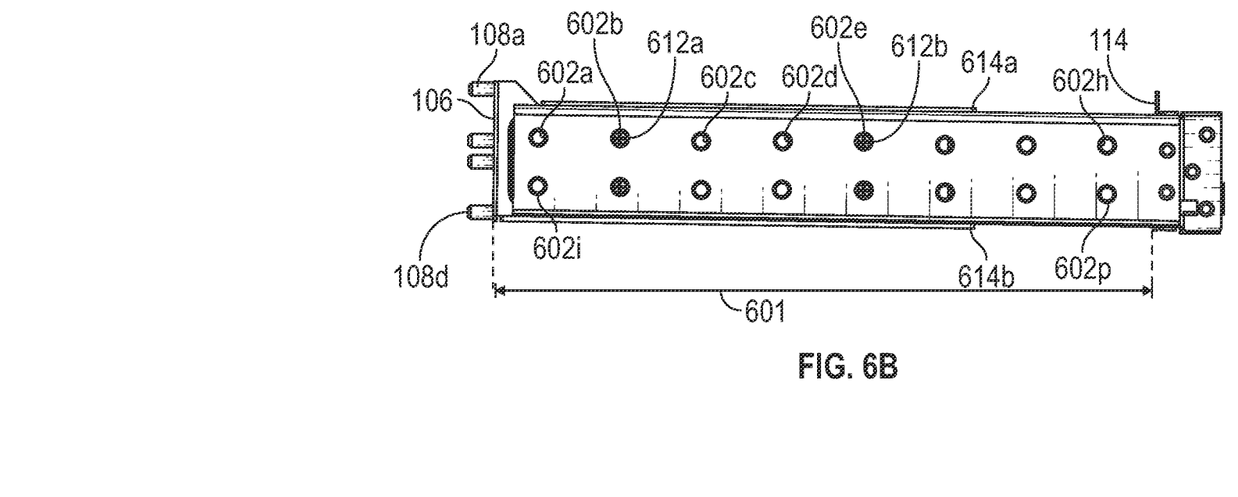
FIG. 6B is a left view of an embodiment of a telescoping rail.

FIG. 6B is a left view of an embodiment of a telescoping rail. In FIG. 6B, screws 612a . . . 612d are disposed in holes 602b, 602e, 602j, 602m, respectively. In this configuration, a distance 601 may be minimized.

In an embodiment, a single fastener 111 may be used in a single slot 110 to constraint movement between an inner and outer rail, with flanges 614a, 614b relied upon to prevent moving inner rail 104 from rotating about that single fastener.

In an embodiment, holes 602a . . . 602p may themselves be elongated slots, providing for further adjustment potential.

Figure 7:
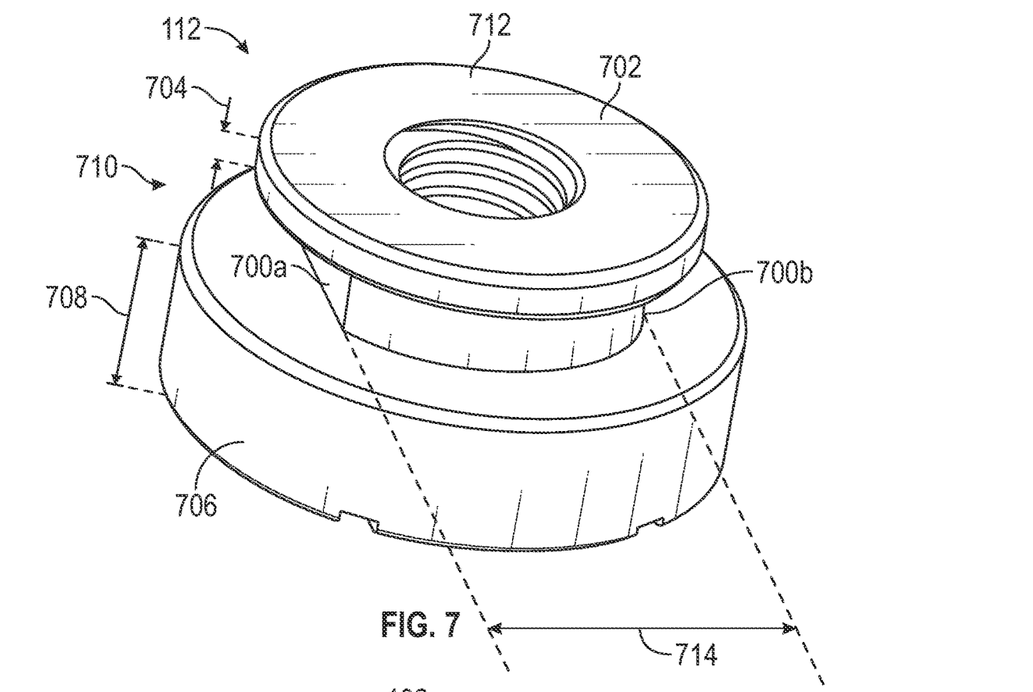
FIG. 7 is an isometric view of an element of an embodiment of a telescoping rail.

FIG. 7 is an isometric view of anti-rotational nut 112 (i.e., anti-rotational nuts 112a . . . 112d) of an embodiment of a telescoping rail. In FIG. 7, anti-rotational nut 112 includes rotation-preventing flats 700a, 700b disposed between an inner nut section 702 and an outer nut section 706. Inner nut section 702 has a thickness 704 and outer nut section 706 has a thickness 708. When nut 112 is installed in slot 110a or 110b as shown in previous figures, the edges of the slot are received in a groove 710 between sections 702 and 704. The width of slot 110a or 110b is configured to be close enough to a width 714 between flats 700a, 700b that rotation of nut 112 causes flats 700a, 700b to contact the slot edge, which prevents further rotation.

In the embodiment, nut 112 may include threads 712, which cooperate with screws 612a . . . 612d to tighten fasteners 111a . . . 111d.

In embodiments, fasteners 111 may include a quarter turn locking fasteners that, when unlocked, allow inner and outer rails 102, 104 to slide for depth adjustment, and may be locked from the inside of rails 102, 104.

Figure 8A:
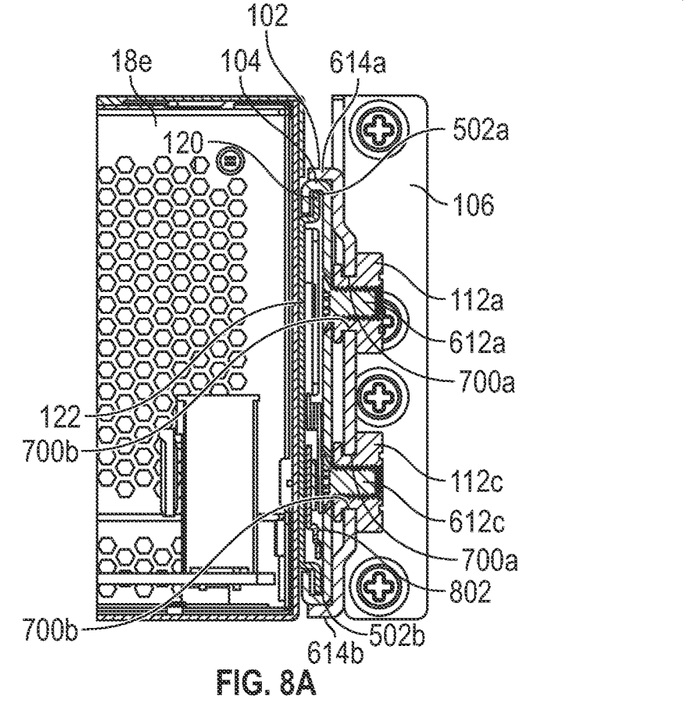
FIG. 8A is a front cross-sectional view of an embodiment of a telescoping rail.

FIG. 8A is a front cross-sectional view of an embodiment of a telescoping rail. In FIG. 8A, moving rail 120 is shown to be attached to electronic device 18e using T-nut 122. Moving rail 120 is also shown to be received by grooves 502a, 502b of inner rail 104. Inner rail 104 is shown to be received between flanges 614a, 614b of outer rail 102. And flats 700a, 700b of anti-rotational nut 112a, 112c are shown to be constrained by edges of slots 110a, 110b within outer rail 102.

Figure 8B:
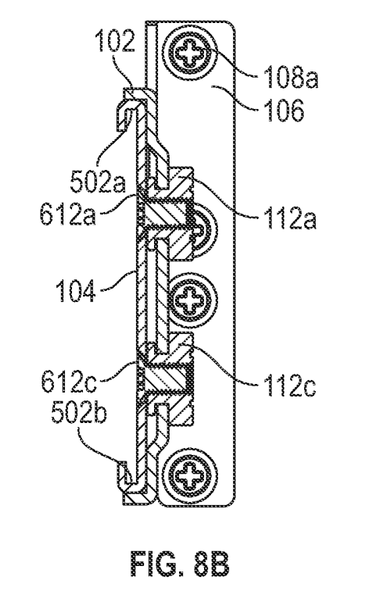
FIG. 8B is a front cross-sectional view of an embodiment of a telescoping rail.
Figure 8C:
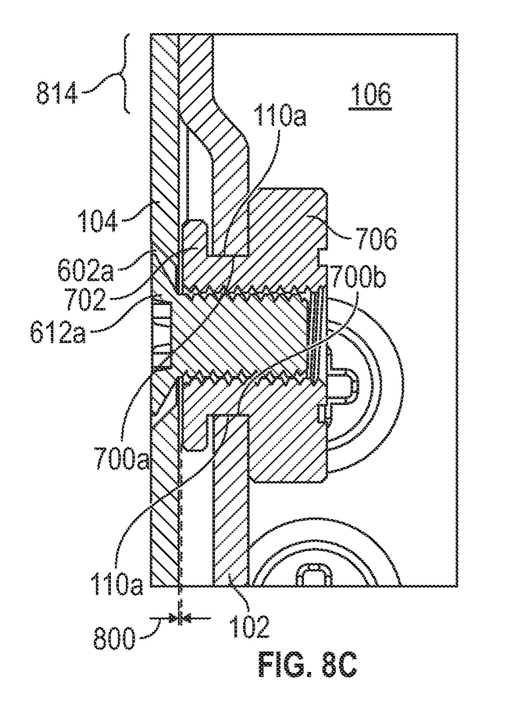
FIG. 8C is a front cross-sectional view of a detail of an embodiment of a telescoping rail.

FIG. 8B and FIG. 8C are front cross-sectional views illustrating details of an embodiment of a telescoping rail. In FIG. 8B, moving rail 120 has been removed to clarify the position of grooves 502a, 502b. FIG. 8C is an enlarged view of a section of FIG. 8B which illustrates that inner nut section 702 lies between outer rail 102 and inner rail 104. Furthermore, inner nut section 702 is thinner than a gap between inner rail 104 and outer rail 102 at slot 110a. Thus, when screw 612a is tightened, it cooperates with nut section 706 to draw inner rail 104 against outer rail 102 at, e.g., section 814, which fixes the length (e.g., lengths 600, 601). A gap 800 illustrates that when screw 612a is tightened, inner rail 104 seats against outer rail 102 and does not seat against nut section 702.

Figure 9A:
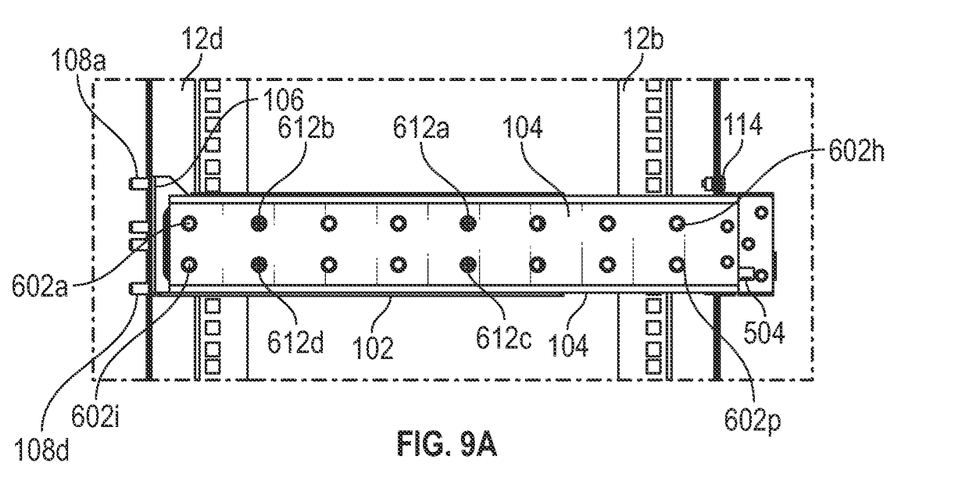
FIG. 9A is a left view of an embodiment of a telescoping rail.
Figure 9B:
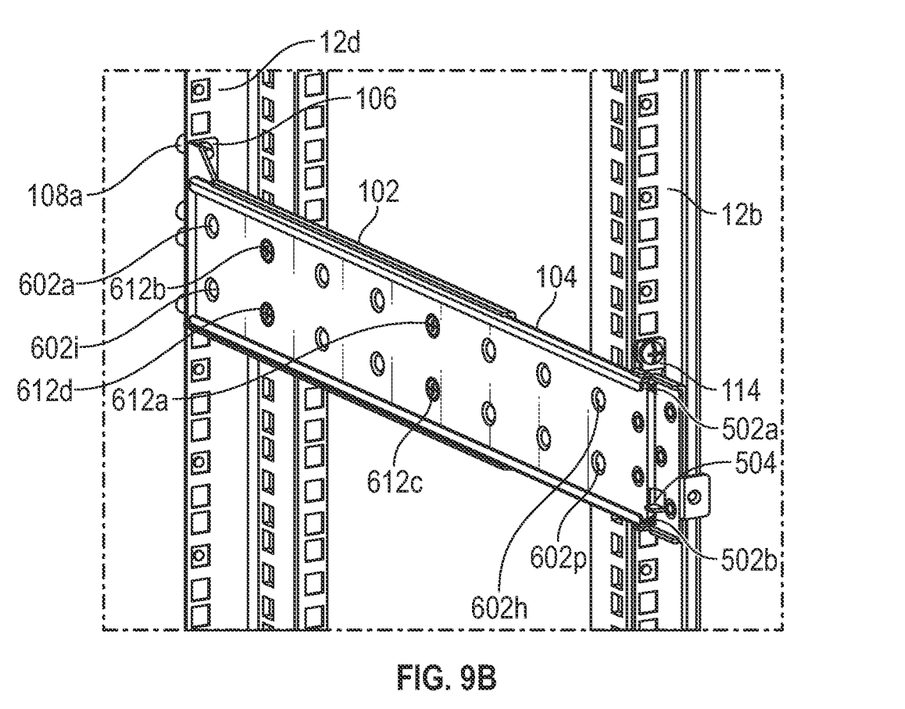
FIG. 9B is a front left isometric view of an embodiment of a telescoping rail.

FIG. 9A is a left view of an embodiment of a telescoping rail and FIG. 9B is a front left isometric view of an embodiment of a telescoping rail. In FIG. 9A and FIG. 9B, moving rail 120 has been removed for clarity. FIG. 9A and FIG. 9B illustrate that different holes 602a . . . 602p may be used to fix the length of telescoping rail 100, with the fastener locations being shown by screws 612a . . . 612d. In addition, guide pins 108a . . . 108d are shown inserted into and through post 12d. In the embodiment, pins 108a . . . 108d are not secured with nuts, or otherwise. Thus pins 108a . . . 108d may be removably inserted into post 12d, the length of rails 102, 104 fixed using screws 612a . . . 612d, and then flange 114 may be fastened to post 12b—all from the interior of cabinet 10. Moving rail 120 may the be inserted into slots 502a, 502b.

That is, in an embodiment of a method for installing telescoping rail 100 into cabinet 10, in a first step, guide pins 108a . . . 108d are inserted into rack holes 900 (FIG. 9C) from the inside of cabinet 10. In a second step, front flange 114 is then fastened to post 12b. In a third step, screws 612a . . . 612d are tightened. In an embodiment, step two may be performed before step three. In an embodiment, step three may be omitted.

Figure 9C:
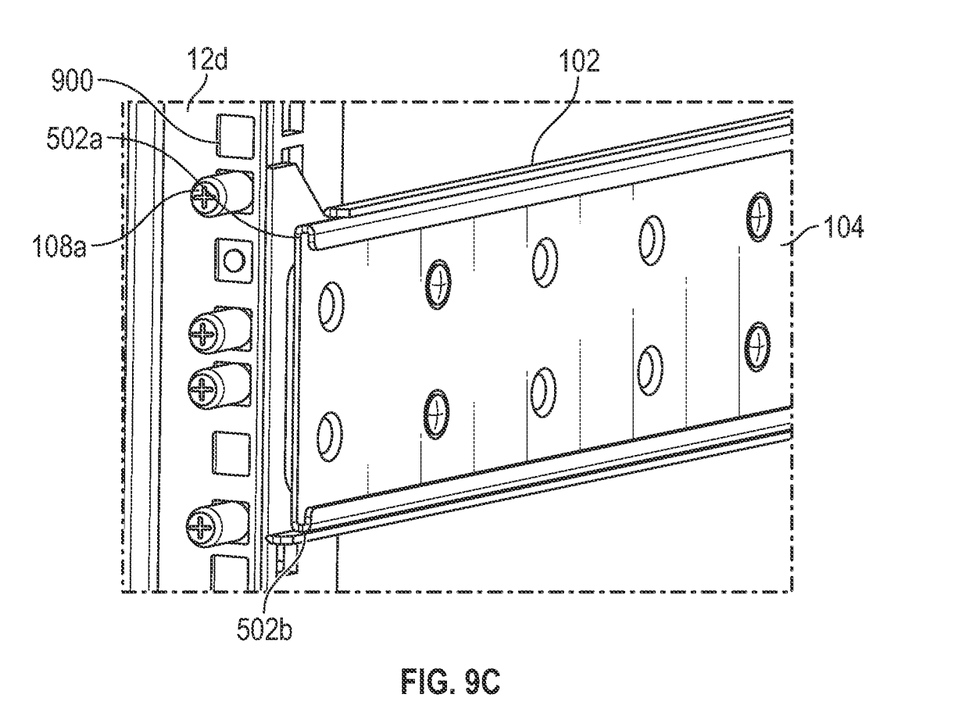
FIG. 9C is a rear left isometric view of a detail of an embodiment of a telescoping rail.

FIG. 9C is a rear left isometric view of a detail of an embodiment of a telescoping rail. In FIG. 9C, rack holes 900 are depicted as being square and guide pins 108a . . . 108d cylindrical. However, in embodiments, pins 108a may be replaceable to adapt telescoping rail 100 to rack posts with differently shaped or sized holes 900. Thus, telescoping rail 100 is able to support square hole, threaded hole, and non-threaded hole racks 10.

Figure 10A:
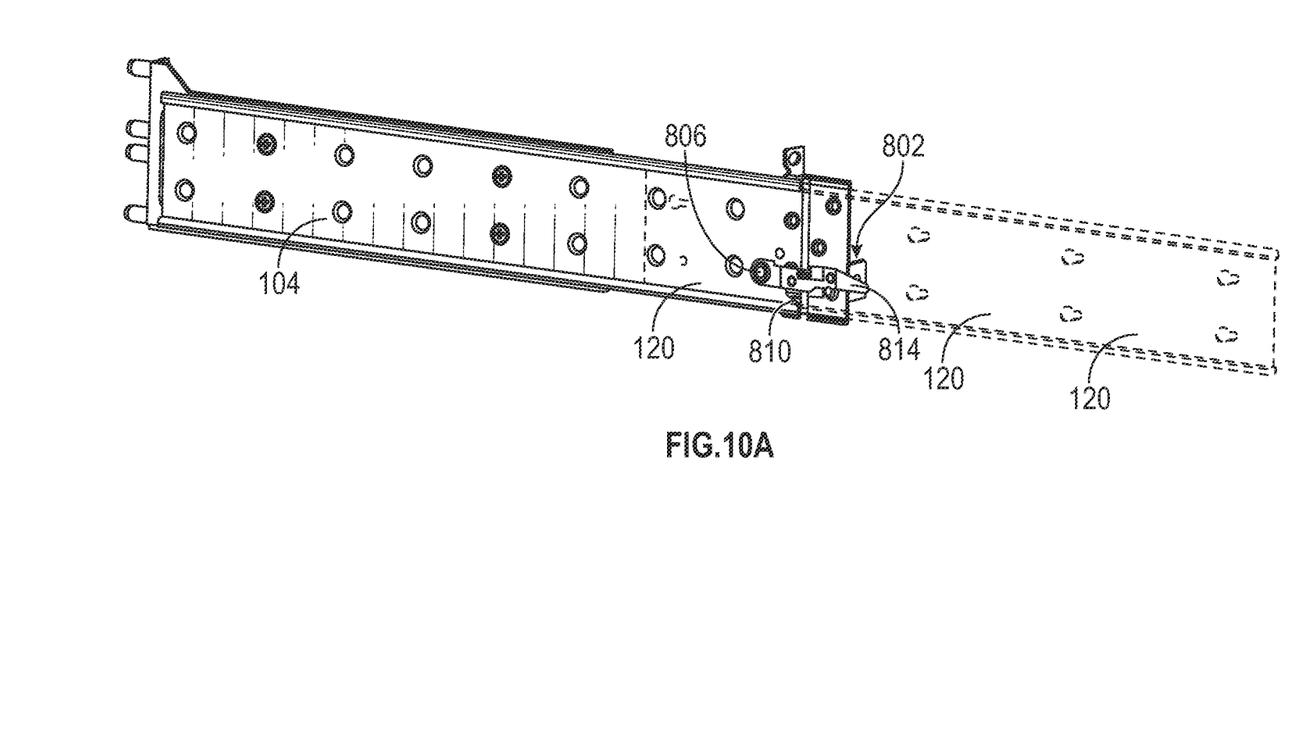
FIG. 10A is a partially transparent front left isometric view of an embodiment of a telescoping rail.
Figure 10B:
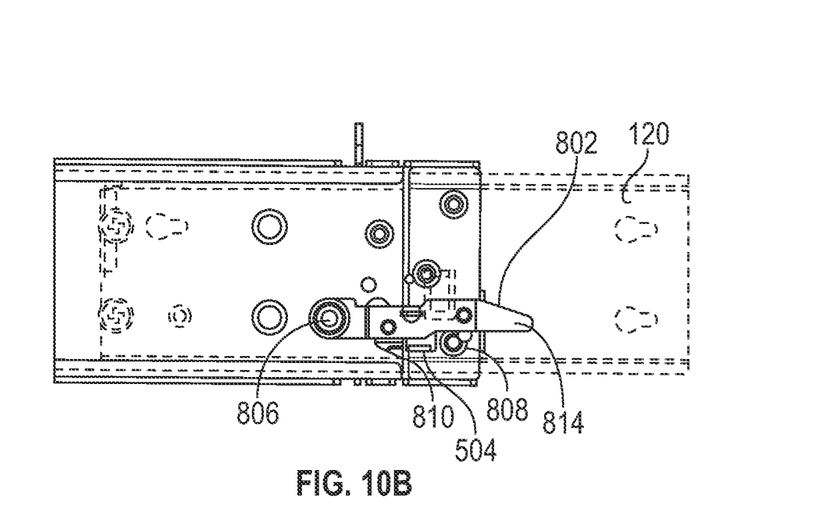
FIG. 10B is a partially transparent left view of elements of an embodiment of a telescoping rail.
Figure 10C:
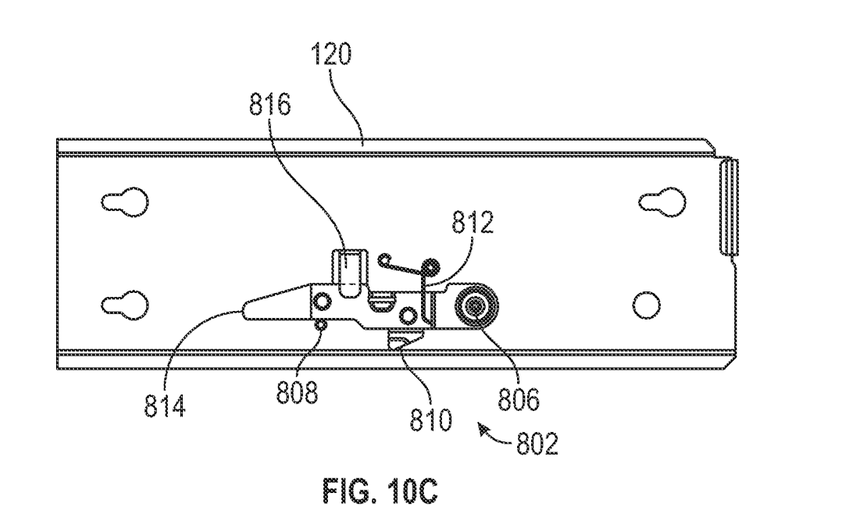
FIG. 10C is a right view of elements of an embodiment of a telescoping rail.

FIG. 10A is a partially transparent front left isometric view of an embodiment of a telescoping rail. FIG. 10B is a partially transparent left view of elements of an embodiment of a telescoping rail. And FIG. 10C is a right view of elements of an embodiment of a telescoping rail. FIGS. 10A-10C illustrate safety latch 802, which includes lever 814, a tooth 810, a pivot 806, and a spring 812 biasing lever 814 downwardly onto a pin 808, as shown. Safety latch 802 is positioned between moving rail 120 and inner rail 104. In the lowered position, as shown in FIGS. 10A, 10B, and 10C, when moving rail 120 is extended from cabinet 10, tooth 810 engages striker 504 of inner rail 104 (FIGS. 6A, 6B, 9A, and 9B) before moving rail 120 completely exits from slots 502a, 502b. Thus safety latch 802 prevents moving rail 120 (and therefore electronic device 18e) from being unexpectedly extracted from telescoping rail 100. To extract moving rail 120 from inner rail 104, a user may pivot tooth 810 upwards about pivot 806 using lever 814 until forward motion of tooth 810 is no longer obstructed by striker 504. When pivoted upward, level 814 moves between a guide flange 816 and the main section of moving rail 120. Electronic device 18e may then be withdrawn from cabinet 10. To install, device 18e is fitted on each side with a moving rail. The rear of each moving rail 120 is guided into slots 502a, 502b of inner rails 104. As device 18e is pushed further into cabinet 10, the ramp on tooth 810 encounters striker 504, overcomes the bias of spring 812, and travels over and past striker 504.

The previous description is provided to enable any person skilled in the art to practice the various aspects described herein. In the embodiments, the separation of various system components in the embodiments described above should not be understood as requiring such separation in all embodiments. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such as a configuration may refer to one or more configurations and vice versa.

All structural and functional equivalents to the elements of the various aspects described throughout this disclosure that are known or later come to be known to those of ordinary skill in the art are expressly incorporated herein by reference and are intended to be encompassed by the claims.

What is claimed is:

1. An apparatus comprising:
   a first rail having a first length and a first end and including a first track, the first track including a slot;
   a second rail having a second length and a second end; and
   a first fastener comprising a screw and a nut, the nut having a first flat and a second flat disposed between a first face and a second face, the first fastener being configured to join the first rail to the second rail,
   wherein the first flat slides along a first edge of the slot and the second flat slides along a second edge of the slot when the first rail is moved with respect to the second rail and the first fastener, and wherein movement of the first rail with respect to the second rail is hindered when the screw is tightened and binds the first rail against the second rail with the first flat acting against the first edge and the second flat acting against the second edge to inhibit rotation of the nut.

2. The apparatus of claim 1, wherein the first rail is on an outer rack-side of the apparatus, the second rail is inward from the first rail, and the screw passes through the second rail into the nut, allowing the screw to be tightened from an inner side of the apparatus.

3. The apparatus of claim 2, wherein:
   the first rail, at the first end, includes a first flange having a first pin configured to engage a first post of a rack; and
   the second rail, at the second end, includes a second flange configured to abut a second post of the rack.

4. The apparatus of claim 3, wherein the first length is less than the second length and the first track is configured to provide for the distance to range from less than the second length to greater than the second length.

5. The apparatus of claim 4, wherein the second rail includes a second track configured to cooperate with a third rail to allow the third rail to move in a first direction between an extended position and a retracted position with respect to the second rail, the third rail being configured to attach to an electronic device.

6. A method comprising:
providing an apparatus including:
- a first rail having a first length and a first end and including a first track, the first track including a slot, and, at the first end, a first flange having a first pin configured to engage a first post of a rack;
- a second rail having a second length and a second end and, at the second end, a second flange configured to abut a second post of the rack;
- a first fastener comprising a screw and a nut, the nut having a first flat and a second flat disposed between a first face and a second face, the first fastener being configured to join the first rail to the second rail, wherein the first flat slides along a first edge of the slot and the second flat slides along a second edge of the slot when the first rail is moved with respect to the second rail and the first fastener, and wherein movement of the first rail with respect to the second rail is hindered when the screw is tightened and binds the first rail against the second rail with the first flat acting against the first edge and the second flat acting against the second edge to inhibit rotation of the nut, and wherein the first rail is on an outer rack-side of the apparatus, the second rail is inward from the first rail, and the screw passes through the second rail into the nut, allowing the screw to be tightened from an inner side of the apparatus;

inserting the first pin into the first post of the rack;
moving the second rail with respect to the first rail to abut the second flange against the second post of the rack; and
tightening the screw from within the rack.

7. The apparatus of claim 6, wherein the first length is less than the second length and the first track provides for the distance to range from less than the second length to greater than the second length.

8. The apparatus of claim 6, wherein the second rail includes a second track configured to cooperate with a third rail to allow the third rail to move in a first direction between an extended position and a retracted position with respect to the second rail, the third rail being configured to attach to an electronic device.

\* \* \* \* \*

UNITED STATES PATENT AND TRADEMARK OFFICE
CERTIFICATE OF CORRECTION

| | |
|---|---|
| PATENT NO. | : 11,659,679 B1 |
| APPLICATION NO. | : 17/508112 |
| DATED | : May 23, 2023 |
| INVENTOR(S) | : Marcade et al. |

It is certified that error appears in the above-identified patent and that said Letters Patent is hereby corrected as shown below:

On the Title Page

Assignee "ZI Group Int'l, Inc" should read -- ZT Group Int'l, Inc. --.

Signed and Sealed this
Twentieth Day of June, 2023

Katherine Kelly Vidal
*Director of the United States Patent and Trademark Office*